United States Patent

Thewes et al.

[19]

[11] Patent Number: 6,138,227
[45] Date of Patent: Oct. 24, 2000

[54] DEVICE FOR THE JUMP-LIKE ADDRESSING OF SPECIFIC LINES OF A SERIALLY OPERATING DIGITAL MEMORY

[75] Inventors: Roland Thewes, Gröbenzell; Doris Schmitt-Landsiedel, Ottobrun; Paul-Werner von Basse, Wolfratshausen; Michael Bollu, München, all of Germany

[73] Assignee: Siemens Aktiengesellschaft, Munich, Germany

[21] Appl. No.: 09/043,046

[22] PCT Filed: Aug. 13, 1996

[86] PCT No.: PCT/DE96/01511

§ 371 Date: Mar. 13, 1998

§ 102(e) Date: Mar. 13, 1998

[87] PCT Pub. No.: WO97/10600

PCT Pub. Date: Mar. 20, 1997

[30] Foreign Application Priority Data

Sep. 13, 1995 [DE] Germany .......................... 195 33 953

[51] Int. Cl.⁷ ................. G06F 12/02; G11C 8/04
[52] U.S. Cl. .................. 711/213; 711/218; 711/109; 365/73; 365/240
[58] Field of Search ............................ 711/109, 110, 711/218, 217, 213; 365/189.12, 73, 78, 240

[56] References Cited

U.S. PATENT DOCUMENTS 5,444,660 8/1995 Yamanaka et al. ................ 365/189.12
5,751,742 5/1998 Von Basse et al. .................... 365/240

FOREIGN PATENT DOCUMENTS 0 305 583 A1 3/1989 European Pat. Off. .
0 738 974 A2 10/1996 European Pat. Off. .

OTHER PUBLICATIONS

Japanese Abstract, vol. 7, No. 266, 58–146080.

*Primary Examiner*—Glenn Gossage
*Attorney, Agent, or Firm*—Hill & Simpson

[57] ABSTRACT

A digital memory matrix having memory cells in rows and columns, addressing of the memory cells is accomplished by control devices which perform arbitrary jumps of address, thereby avoiding addressing on adjacent lines. The jump increment is selectable. The control devices are control chains, two of which are provided, and the outputs of the control chains are connected to linking elements that in turn are connected to the memory lines. The linking elements are provided in groups.

3 Claims, 1 Drawing Sheet

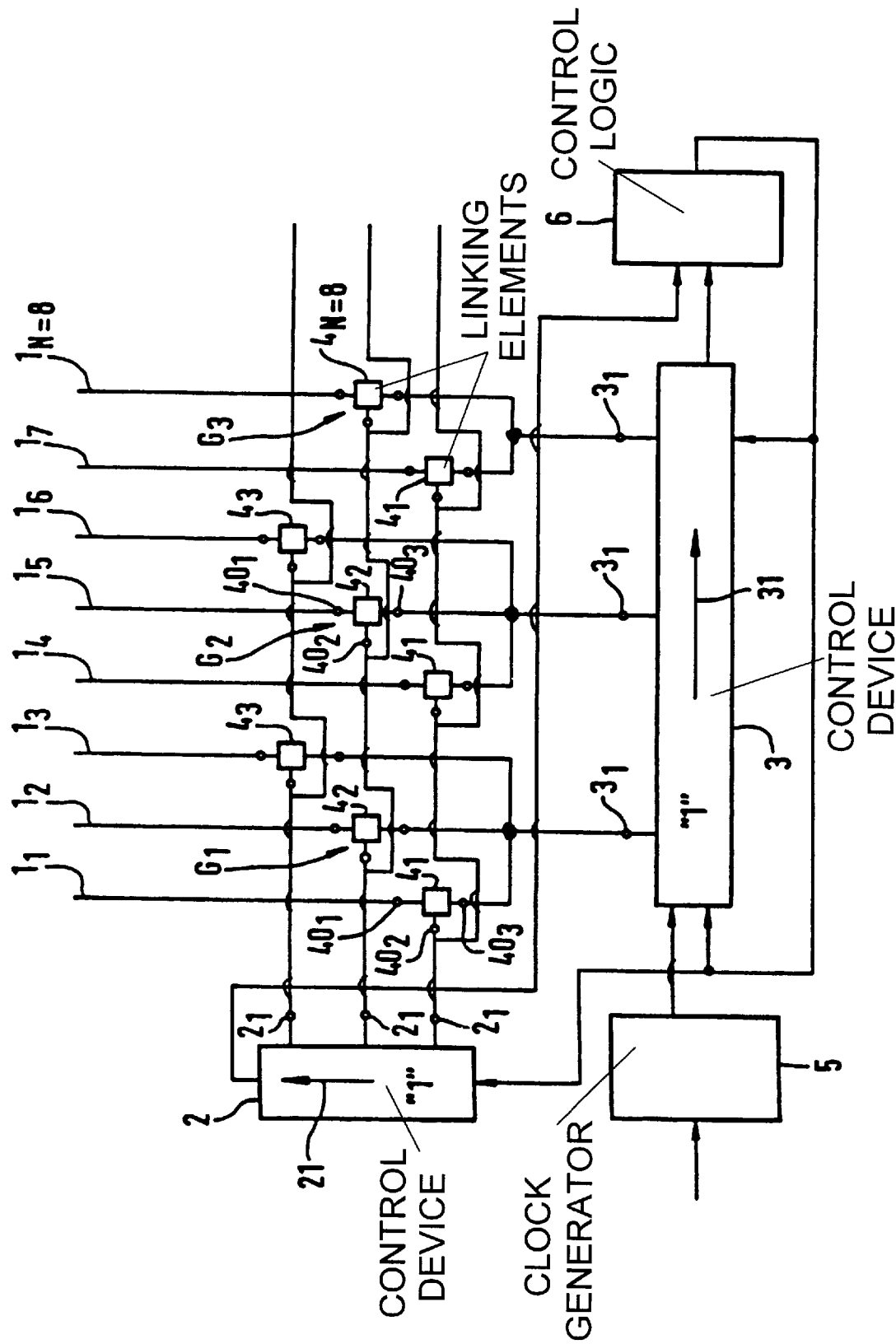

DEVICE FOR THE JUMP-LIKE ADDRESSING OF SPECIFIC LINES OF A SERIALLY OPERATING DIGITAL MEMORY

BACKGROUND OF THE INVENTION

1. Field of the Invention

The present invention relates to a device for the jump-like addressing of specific lines of a serially operating digital memory.

2. Description of the Related Art

Serially operating memories comprise a memory matrix consisting of memory cells arranged in rows and columns in a matrix form and decoders or other control devices, for example control chains (see, for example, the German Patent Application P 195 12 791.9, which are also called pointers.

The memory matrix contains, in addition to the memory cells, bit lines and word lines running at right angles to the latter. Each memory cell is connected to a bit line and is driven by a word line.

If a word line is addressed by a word decoder or, for example, by a word control chain or pointer, that is to say if it is selected, then the memory cells on this word line deliver their information to the bit lines assigned to them. Subsequently, via a bit decoder or, for example, a bit control chain, one of the bit lines and hence the information of a specific memory cell is addressed, that is to say selected.

In sequentially operating memories, this process takes place continuously, so that all the memory cells are addressed consecutively. However, in order to obtain information from the memory which can be corrected as far as possible (redundant codes), the cells of one word line or bit line must not be read out directly one after the other. In the case of completely faulty bit lines or word lines, the information content of the memory cell could in this case no longer be corrected. However, failures of adjacent word lines and bit lines occur very frequently. It is therefore beneficial to arrange the bit decoders or word decoders or control chains in such a way that they never drive the directly adjacent lines when the selection lines are changed. Such a method is designated here as, in particular, sequential, jump-like addressing.

Using the normal binary decoders, this jump-like addressing can be achieved in several ways:

1) For example, the binary address fed to the decoders is not increased continuously but with regular jumps.
2) The decoders are constructed in such a way that, if the binary address fed to a decoder is increased continuously, outputs from the decoder are jumped over at regular intervals.
3) The binary address is divided into a jump address and a selection address. Because of the binary addresses, such a division of the address permits only group sizes which are an integer part of all the lines to be selected, otherwise not all the lines are selected or some addresses select no lines, so that so-called empty addresses are produced. If it is intended to achieve jumps which are an integer part of all the lines to be selected, then the binary address must be increased using these jumps. This condition is required for serially operated memories see the abovementioned German reference P 195 12 791.9).

SUMMARY OF THE INVENTION

As a result of the device described below, for the jump-like addressing of specific lines of a serially operating digital memory, any arbitrary jump increments can advantageously be implemented. In particular, the invention provides a device for the jump-like addressing of specific lines of a serially operating digital memory, having two control devices which are jointly assigned to the specific lines, each of the control devices having a plurality of outputs and, at the outputs, chronologically successively generates a specific binary information item assigned to the respective the control device and decisive for addressing one of the specific lines, a plurality of linking elements, each of the linking elements being assigned to one of the specific lines and having an output assigned to this specific line, the linking elements each having an input assigned to one of the two control devices as well as an input assigned to an other one of the two control devices, each of the linking elements addressing precisely the one of the specific lines assigned to it alone via its output precisely when there is present at its input assigned to the one control device the specific binary information item assigned to the control device and, simultaneously, there is present at its input assigned to the other control device the specific binary information item assigned to the other control device, the linking elements being subdivided into groups which do not share the same elements and in each case have a plurality of linking elements, the groups together yielding all the linking elements, the inputs assigned to the one of the two control devices, of the linking elements being connected to the outputs of this control device in such a way that each of the outputs is connected to only one of the inputs of each of the group, and the inputs, assigned to the other control device, of the linking elements being connected in groups to the outputs of this other control device in such a way that the inputs of each of the groups are jointly connected to one of the outputs assigned to this group alone.

In the case of the device according to the invention, the specific lines to be addressed in jump-like fashion are, according to the invention, assigned two control devices. The specific lines can, for example, be the bit lines or else the word lines of the memory or both.

Each of these control devices is constructed such that it has a plurality of outputs and, at these outputs, chronologically successively generates a specific binary information item assigned to this control device and decisive for addressing a specific individual line.

Each control device may be implemented, for example, by a control chain.

Control chains operate like shift registers, which, in addition to a binary information item, for instance the information item "0", contain the other binary information item, in the example assumed the information item "1", only once. This other binary information item appears at only one output of the control chain, while all the other outputs of this control chain have the other binary information item. The other binary information item can be shifted further in a predetermined direction from output to output of the control chain by means of a clock.

The jump increment, that is to say the number of specific lines which are jumped over during the addressing from one to the next specific line, is determined, in the case of the device according to the invention, by the number p of the outputs of the one control device, according to p−1, and is freely selectable, so that any arbitrary jump increment can be set. The number p is preferably selected such that $1 \leq p-1 < N$ is true. N is the total number of specific lines.

The number q of the outputs of the other control device is determined by p and N.

The device according to the invention is operated by generating successively at the outputs of the one control device the specific binary information assigned to the one control device, maintaining the specific binary information item at each of the outputs for a specific period of time (T), and generating successively during this period of time the specific binary information assigned to the other control device at all the outputs of the other control device.

The invention will be explained in more detail in the following description, by way of example, with reference to the FIGURE.

BRIEF DESCRIPTION OF THE DRAWINGS

The FIGURE shows, in a schematic representation, a circuit diagram of the device according to the invention, which is designed for N=8 lines and a jump increment p−1=2, that is to say jumping over two lines.

DETAILED DESCRIPTION OF THE PREFERRED EMBODIMENTS

In the FIGURE, the N=8 lines of the digital memory with serial operation are designated by $1_1$ to $1_{N=8}$. The memory itself is not shown. The lines 11 to $1_N$ can be bit lines and/or word lines of this memory.

The device according to the invention for jump-like addressing has, according to the invention, two devices 2 and 3 which are jointly assigned to the specific lines $1_1$ to $1_N$, each of which control devices has a plurality of outputs $2_1$ and $3_1$, respectively, and, at these outputs $2_1$ or $3_1$, chronologically successively generates a specific binary information item assigned to this control device 2 or 3 and decisive for addressing a specific line $1_1, 1_2, \ldots 1_N$, respectively, for example in each case the information item "1".

Furthermore, according to the invention, a plurality of linking elements $4_1, 4_2, \ldots 4_N$ are provided, each of which is assigned to a specific line $1_1, 1_2, \ldots 1_N$, respectively, and has an output $40_1$ assigned to this line $1_1, 1_2, \ldots 1_N$, respectively, an input $40_2$ assigned to one of the two control devices 2, 3, for example to the control device 2, as well as an input $40_3$ assigned to the other control device, in the example assumed the control device 3.

Each linking element $4_1, 4_2 \ldots 4_N$, respectively, addresses the specific line $1_1, 1_2, \ldots 1_N$, respectively, assigned to it alone via its output $40_1$, precisely when there is present at its input $40_2$ assigned to the one control device 2 the binary information item assigned to this one control device 2, in the example the information item "1", and simultaneously there is present at its input $40_3$ assigned to the other control device 3 the binary information item assigned to this other control device 3, in the example likewise the information item "1", of this other control chain 3.

According to the invention, the linking elements $4_1$ to $4_N$ are subdivided into groups $G_1, G_2, \ldots G_{q=3}$ which do not share the same elements and in each case have a plurality of linking elements, which groups together yield all the linking elements $4_1$ to $4_N$.

The inputs $40_2$, assigned to the one control device 2, of the linking elements $4_1$ to $4_N$ are connected to the outputs $2_1$ of this control device 2 in such a way that each of these outputs $2_1$ is connected to only one of these inputs $40_2$ of each group $G_1, G_2, \ldots G_q$, respectively.

The inputs $40_3$, assigned to the other control device 3, of the linking elements $4_1$ to $4_N$ are connected in groups to the outputs $3_1$ of this other control device 3 in such a way that these inputs $40_3$ of each group $G_1, G_2, \ldots G_q$, respectively, are jointly connected to one of these outputs $3_1$ assigned to this group $G_1, G_2, \ldots G_q$, respectively, alone.

If, in general, N specific lines $1_1$ to $1_N$ are prescribed and if the jump increment p−1 is selected, the procedure is expediently carried out such that the N lines or N linking elements are subdivided into q=[N/p] groups $G_1$ to $G_q$, and following that another control device 3 with q=[N/p] ouputs $3_1$ is selected. In this case [N/p]=N/p, if N can be divided by p without a remainder, otherwise [N/p] is the next higher natural number above N/p. In the case of N=8 and p=3, for example, N/p=2+⅔ and, accordingly, [N/p] is equal to 3.

The subdivision into groups $G_1$ to $G_q$ is furthermore undertaken in such a way that each group $G_1$ to $G_q$, has the same number of linking elements, if appropriate down to 1; thus, as in the example assumed, in which of the q=3 groups $G_1$, $G_2$ and $G_3$ available, the group $G_1$ having the linking elements $4_1, 4_2$ and $4_3$ and the group $G_2$ having the linking elements $4_4, 4_5$ and $4_6$ in each case have three linking elements and only the third and last group $G_3$ having the linking elements $4_7, 4_8$ has only two linking elements, because of the number of N=8 lines not being divisible by 3 without a remainder.

Instead of the control device 2, the control device 3 could also be selected as the one control device and, instead of the control device 3, the control device 2 could be selected as the other control device. In this case, each output $2_1$ of the control device 2 would be connected to the linking elements of only one group $G_1, G_2, \ldots G_q$ and each output $3_1$ of the control device 3 would be connected in each case to one linking element in each group $G_1, G_2, \ldots G_q$, respectively.

Each control device 2, 3 preferably comprises a control chain in which the binary information item assigned to this control device 2 or 3, for example the information item "1", appears chronologically successively in a specific direction 21 or 31 at the outputs $2_1$ or $3_1$, arranged one after another in this direction 21 or 31, of this control device 2 or 3.

The exemplary embodiment according to the invention is operated in such a way that the specific binary information item "1" assigned to the one control device 2 is generated successively at the outputs $2_1$ of this control device 2, at each of these outputs $2_1$ this generated specific binary information item "1" is in each case maintained for a specific period T, and during this period T the specific binary information item "1" assigned to the other control device 3 is generated successively at all the outputs $3_1$ of the other control device 3.

In the exemplary case that both the binary information items are respectively "1", each linking element $4_1$ to $4_N$ can be an AND element, which can be implemented by means of a single transistor. For example, this transistor can be a MOS (metal oxide semiconductor) transistor, whose gate and drain or source connection form the two inputs $40_2$ and $40_3$ and whose source or drain-connection forms the output $40_1$ of this linking element.

In the general case, the one control device has 2×p<N outputs $2_1$, and the other control device has 3×q<N outputs $3_1$. By using p and q, which are both natural numbers, the jump increment can be set arbitrarily to a large extent. In the example shown with N=8, the smallest jump increment which makes a jump-like addressing possible is selected, that is to say the jump-like addressing jumps from one specific line to the one more than the next. This means that the jump increment is equal to 3. The value of p, which is decisive for the jump increment, is accordingly selected to be equal to 3. Since there are only N=8 lines, q=3 is sufficient.

In the example shown, the specific binary value "1" would move in the one control device 2 from the lowest output $2_1$ to the uppermost output $2_1$ and, in the control device 3, the associated specific binary value "1" would move from the output $3_1$ lying furthest to the left in the direction 31 to the output $3_1$ lying furthest to the right.

At the start, both control devices 2 and 3 should be set such that their specific binary values "1" are located at the lowest output $2_1$ at the output $3_1$ located furthest to the left. Then, at the start, the specific line $1_1$ is addressed, since the two binary values "1" are present only on the linking element $4_1$ connected to this line $1_1$.

At the next clock signal, only the binary value "1" of the other control device 3 is shifted in the direction 31 to the next output $3_1$. In the one control device 2, on the other hand, the binary value "1" remains at the lowest output $2_1$. The line $1_4$ is now selected, since the binary value "1" is present twice only on the linking element $4_4$.

At the next clock signal increment, the binary value "1" in the one control device 2 remains further on the lowest output $2_1$ and only the binary value "1" in the other control device 3 is shifted in the direction 31 to the next and last output $3_1$. The line $1_7$ is now selected, since the binary value "1" is present twice only on the linking element $4_7$. At the next clock increment, the /binary value "1" in the other control device 3 is shifted out of this device 3 and is brought once more to the output $3_1$ located furthest to the left in this device 3. At the same time, in the one control device 2, the binary control value "1" is shifted in the direction 21 to the next output $2_1$ of this device 2. The line $1_2$ is now selected, since the binary value "1" is present twice only on the linking element $4_2$.

At the next clock signal, the binary value "1" in the one control device 2 remains once more on the next output $2_1$, and in the other control device 3, the binary value "1" is successively shifted from output $3_1$ to output $3_1$. In this way, the lines $1_5$ and $1_8$ are successively addressed.

After this, the binary value "1" in the other control device 3 is shifted out of this device 3 and brought once more to the output $3_1$ of this device 3 located furthest to the left, while the binary value "1" in the one control device 2 is shifted in the direction 21 to the uppermost and last output $2_1$ and remains there.

During the time that the binary value "1" remains at the uppermost output $2_1$ of the one control device 2, the binary value "1" in the other control device 3 is successively shifted in the direction 31 from output $3_1$ to output $3_1$. As a result, the lines $1_3$ and $1_6$ are successively selected.

Since in this case the binary value "1" of the other control device 3 which is located on the output $3_1$ of this control device 3 which is located furthest to the right no longer has a line assigned to it, since in the example we have only N=8 and there are not 9 lines present, it is expedient to delete the binary value "1" present at the last output $3_1$ and to shift it out of the other control device 3 and, likewise, to delete the binary value "1" present on the uppermost output $2_1$ and to shift it out of the one control device 2 and then once more to occupy the lowest output $2_1$ of the one control circuit 2 and the output $3_1$ of the other control circuit 3 located furthest to the left with the binary value "1", following which the previously described procedure runs again from the beginning.

The clock signal for shifting the binary value "1" of the other control device 3 from output $3_1$ to output $3_1$ of this device 3 is supplied, for example, by a clock generator 5. The occupation with the binary value of the output $3_1$ of the other control device 3 located furthest to the left and of the lowest output $2_1$ of the one control device 2, the shifting of the binary value "1" of the one control device, from output $2_1$ to output $2_1$ and the deleting of the binary value 2 from the output $3_1$ of the other control device 3 located furthest to the right are effected, for example, by means of control logic 6.

In the case of the device according to the invention, both the driving method—wherein only one clock is needed— and the structure—having control chains with logic—of the jump-like selection, in the case of serially operating memories with control chains, are advantageously significantly simpler than using binary decoders.

Although other modifications and changes may be suggested by those skilled in the art, it is the intention of the inventor to embody within the patent warranted heron all changes and modifications as reasonably and properly come within the scope of his contribution to the art.

What is claimed is:

1. A device for jump-like addressing of specific lines of a serially operating digital memory, comprising:

two control devices which are jointly assigned to the specific lines, wherein each of said two control devices has a plurality of outputs and, at said outputs, chronologically successively generates a specific binary information item assigned to a respective one of said two control devices and decisive for addressing one of said specific lines, a plurality of linking elements, each of said linking elements being assigned to one of said specific lines and having an output assigned to respective ones of said specific lines, said linking elements each having an input assigned to one of the two control devices as well as an input assigned to an other one of said two control devices, each of said linking elements addressing the one of said specific lines assigned to that respective linking element alone via its output precisely when there is present at its input assigned to the one control device the specific binary information item assigned to that control device and, simultaneously, there is present at its input assigned to the other control device the specific binary information item assigned to the other control device, the linking elements being subdivided into groups which do not share the same elements and in each case have a plurality of linking elements, the groups together yielding all the linking elements inputs, assigned to the one of the two control devices, of the linking elements being connected to the outputs of the corresponding control device in such a way that each of said outputs is connected to only one of said inputs of each of said groups and inputs, assigned to the other control device, of the linking elements being connected in groups to the outputs of the other control device in such a way that the inputs of each of said groups are jointly connected to one of the outputs assigned to this group alone.

2. A device according to claim 1, wherein at least one of said two control devices includes a control chain in which an associated binary information item appears chronologically successively in a specific direction at the outputs of that control device.

3. A method for jump-like addressing of specific lines, in a device as claimed in claim 1, comprising the steps of:

generating successively specific binary information item assigned to one control device at outputs of that control device, maintaining at each of said outputs the generated specific binary information item for a specific period, and generating successively during said specific period the specific binary information item assigned to an other control device at all outputs of the other control device.

* * * * *